US005966315A

United States Patent [19]

Muller et al.

[11] Patent Number: 5,966,315

[45] Date of Patent: Oct. 12, 1999

[54] SEMICONDUCTOR MEMORY HAVING HIERARCHICAL BIT LINE ARCHITECTURE WITH NON-UNIFORM LOCAL BIT LINES

[75] Inventors: Gerhard Muller, Wappingers Falls, N.Y.; Heinz Hoenigschmid, Starngberg, Germany

[73] Assignee: Siemens Aktiengesellschaft, Munich, Germany

[21] Appl. No.: 08/942,275

[22] Filed: Sep. 30, 1997

[51] Int. Cl.[6] .............................. G11C 5/02; G11C 5/06; G11C 7/02

[52] U.S. Cl. ............................... 365/51; 365/63; 365/207

[58] Field of Search ............................... 365/51, 63, 190, 365/207, 208, 230.03

[56] References Cited

U.S. PATENT DOCUMENTS 5,757,692 5/1998 Suh .......................................... 365/63

*Primary Examiner*—Trong Phan

*Attorney, Agent, or Firm*—Stanton C. Braden

[57] ABSTRACT

Disclosed is a semiconductor memory (18, 20, 100, 200) having a hierarchical bit line architecture including local bit lines ($LBL_1$, $LBL_2$) on a lower fabrication layer, coupled to memory cells (MC), and master bit lines (MBL) on a higher fabrication layer, each coupled to an associated sense amplifier ($SA_i$). Local bit lines disposed in any given column are coupled to different numbers of memory cells, i.e., the local bit lines have different lengths (L1, L2) over the memory cells. A hybrid configuration is preferably employed in which one local bit line ($LBL_1$) in a column is directly coupled via a switch ($25_1$) to an associated sense amplifier, whereas the other local bit lines in the column ($LBL_2$–$LBL_4$) are operatively coupled to the sense amplifier via the master bit line. The different local bit line lengths are preferably selected such that total bit line capacitance with respect to any of the memory cells is substantially equalized, thereby improving data retention time for the memory.

20 Claims, 6 Drawing Sheets

L1
L2
18
MBL
$25_2$
$LBL_2$
63
MC
$LBL_1$
MC
d
MC
$SA_i$
$25_1$
$C_i$
63
MC
$\overline{LBL}_1$
MC
d
MC
$25_2$
$\overline{LBL}_2$
$\overline{MBL}$
$23_1$
$23_2$
$WL_{j-1}$
$WL_j$ 100
L1
L2
L2
L2
LBL$_1$
LBL$_2$
LBL$_3$
LBL$_4$
$\overline{LBL}_1$
$\overline{LBL}_2$
$\overline{LBL}_3$
$\overline{LBL}_4$
MBL
MBL
$\overline{MBL}$
$\overline{MBL}$
MC
MC
MC
MC
25$_1$
25$_2$
25$_3$
25$_4$
23$_1$
23$_3$
23$_4$
WL$_j$
WL$_{j-1}$
35
35
36
36
63
63
SA$_i$

SEMICONDUCTOR MEMORY HAVING HIERARCHICAL BIT LINE ARCHITECTURE WITH NON-UNIFORM LOCAL BIT LINES

FIELD OF THE INVENTION

The present invention relates to semiconductor memories such as dynamic random access memories (DRAMs), and more particularly, to a semiconductor memory having a hierarchical bit line architecture with master bit lines and local bit lines.

BACKGROUND OF THE INVENTION

The hierarchical or "segmented" bit line architecture was developed in recent years in order to increase the integration density of memory chips. This architecture allows for a reduced number of space-consuming sense amplifiers for a given number of memory cells, thus reducing chip size or increasing memory capacity for a given size chip.

In a conventional hierarchical bit line architecture, each column of the memory cell array includes a number of equal length local bit lines (LBLs), directly connected to the memory cells, and a master bit line (MBL) composed of a high conductivity metal disposed at a higher fabrication layer than the local bit lines. For example, each local bit line may connect to several hundred memory cells. Each master bit line is connected directly to a sense amplifier and is selectively coupled to a number of local bit lines in a common column via a number of switches. To access (read, write or refresh) a memory cell connected to a particular local bit line, the switch connecting that local bit line to the master bit line is closed while the other switches in the column are opened.

FIG. 1 illustrates a memory bank 10 of a prior art semiconductor memory utilizing a hierarchical bit line architecture. The memory bank is divided into subarrays of memory cells, e.g., MAa to MAd, and a number of sense amplifier banks such as $\mathbf{12}_j$, $\mathbf{12}_{j+1}$, $\mathbf{12}_{j+2}$. In the shown configuration, the sense amplifiers $SA_i$ within each sense amplifier bank are arranged in a shared configuration, such that each sense amplifier amplifies signals from memory cells on both sides thereof in a time multiplexed manner. Each subarray has N columns $C_1$–$C_N$; however, since the sense amplifiers are shared, each SA bank has N/2 sense amplifiers. Each sense amplifier, e.g., $SA_2$ of bank $\mathbf{12}_{j+1}$ is connected on each side to a master bit line pair consisting of a true master bit line MBL and a complementary master bit line $\overline{MBL}$. In this example, each true master bit line MBL is connected to four true local bit lines $LBL_1$ to $LBL_4$ of equal length L, and each complementary master bit line $\overline{MBL}$ is connected to four complementary local bit lines $\overline{LBL_1}$ to $\overline{LBL_4}$. The sense amplifier amplifies a differential voltage between the pair of master bit lines—one master bit line is used to carry a reference voltage while the other carries a cell signal transferred thereto by activation of a selected memory cell MC. A word line $WL_j$ in the jth row is activated in accordance with the row address to access the selected memory cell. The configuration shown is known as a folded bit line architecture, wherein the true and complementary bit lines run side by side one another in close proximity. If an open bit line configuration were used, the complementary master bit line would reside on the opposite side of the sense amplifier as the true master bit line.

FET switches S are each coupled between an end portion of a respective local bit line and a connection point P connecting the corresponding master bit line. Memory cells coupled to a particular local bit line are accessed by closing the corresponding switch S and opening the other switches in the corresponding column by appropriate control voltages on control lines $\mathbf{23}_1$–$\mathbf{23}_4$.

In general, bit line capacitance is proportional to bit line length. As such, bit line length is limited by the maximum bit line capacitance that can be tolerated. The maximum capacitance is generally determined by the allowable sensing margin and the power dissipation. With the hierarchical bit line architecture, the master bit line capacitance per unit length is less than the local bit line capacitance per unit length, since the local bit lines are directly coupled to the memory cells which significantly contribute to the local bit line capacitance, whereas the master bit lines are not directly coupled to the cells. Thus, for a given column length, the total capacitance can be significantly less than in a non-hierarchical layout (i.e., layouts with only one layer of bit lines, each extending the entire column length and directly coupled to the memory cells). Therefore, by using a hierarchical architecture, less space-consuming sense amplifiers are needed for a chip with a specific number of memory cells. That is, the architecture permits each sense amplifier to be used for more cells, coupled to the local bit lines and one long master bit line, thereby reducing the number of sense amplifiers per chip. A smaller chip size is thus possible, provided that the area allocated to the switches S and additional control circuitry does not exceed the area saved by reducing the number of sense amplifiers.

FIG. 2 illustrates a variation of the above-discussed hierarchical bit line architecture. The shown configuration will be referred to hereafter as a "hybrid" type hierarchical architecture. FIG. 2 shows the case in which only two local bit line pairs ($LBL_1$, $\overline{LBL_1}$) and ($LBL_2$, $\overline{LBL_2}$) are disposed on each side of an associated sense amplifier $SA_i$. In each column $C_i$ of a memory cell subarray, the local bit lines nearest the sense amplifier, i.e., $LBL_1$ and $\overline{LBL_1}$, are connected to the drain or source of a respective switch $\mathbf{25}_1$, with the other side of the switch connecting directly to the sense amplifier electronics at a circuit node 63. This circuit node 63 is generally the same circuit node that connects the sense amplifier electronics to the corresponding master bit line MBL or $\overline{MBL}$. A switch $\mathbf{25}_2$ is coupled between each far side local bit line $LBL_2$ and $\overline{LBL_2}$ and the corresponding master bit line at a connection node d. Gaps g separate $LBL_1$ from $LBL_2$ and $\overline{LBL_1}$ from $\overline{LBL_2}$. To access a memory cell MC coupled to $LBL_1$ or $\overline{LBL_1}$, switches $\mathbf{25}_1$ are turned on (closed) while switches $\mathbf{25}_2$ are off, and vice versa to access cells coupled to the far side local bit lines $LBL_2$ and $\overline{LBL_2}$. Thus, memory cells coupled to the far side local bit lines are operatively coupled to the sense amplifier via the far side local bit line and the master bit line, whereas those cells coupled to the near side local bit line are coupled to the sense amplifier only via the near side local bit line. As such, the configuration of FIG. 2 is referred to as a hybrid. If more than two local bit line pairs are used on each side of the sense amplifier, then the path connecting the memory cells coupled to the near-side local bit lines $LBL_1$ and $\overline{LBL_1}$ consists of only the local bit line whereas the paths connecting the sense amplifier to the other memory cells in the column consists of the master bit line in series with the respective local bit line.

SUMMARY

The present invention is directed towards a semiconductor memory having a hierarchical bit line architecture in which local bit lines disposed in any given column are coupled to different numbers of memory cells in order to substantially equalize total bit line capacitance with respect to any of the memory cells, thus improving data retention time for the memory.

In an exemplary embodiment, a semiconductor memory in accordance with the present invention includes a plurality of rows and columns, where each column has a sense amplifier with a master bit line operatively coupled thereto. A plurality of local bit lines are disposed in each column, each coupled to plural memory cells, vertically spaced from the master bit line, and selectively coupled to the sense amplifier. At least one of the local bit lines in the column is selectively coupled to the sense amplifier via the master bit line. At least a first one of the local bit lines in the column is coupled to a different number of memory cells than at least a second one of the local bit lines in the column.

Preferably, a hybrid-type hierarchical bit line configuration is employed in which a near side local bit line is directly coupled to the sense amplifier via a switch, and one or more far side local bit lines in the column are operatively coupled to the sense amplifier via the master bit line. For this embodiment, the near side local bit line is coupled to more memory cells than the other local bit line(s) in the column.

DETAILED DESCRIPTION OF THE INVENTION

The present invention relates to an improved hierarchical bit line architecture for semiconductor memories. The invention provides a way to equalize total bit line capacitance, thereby improving retention time for the memory cells in the array. For purposes of discussion, an exemplary embodiment of the invention is described in the context of a DRAM chip. The invention however has broader applications. Merely by way of example, the invention has application in other memory devices such as EDO-DRAM, SDRAM, RAMBUS-DRAM, SLDRAM, MDRAM, SRAM, flash RAM, EPROM, EEPROM, mask ROM, or merged DRAM-logic (embedded DRAM).

Figure 1:
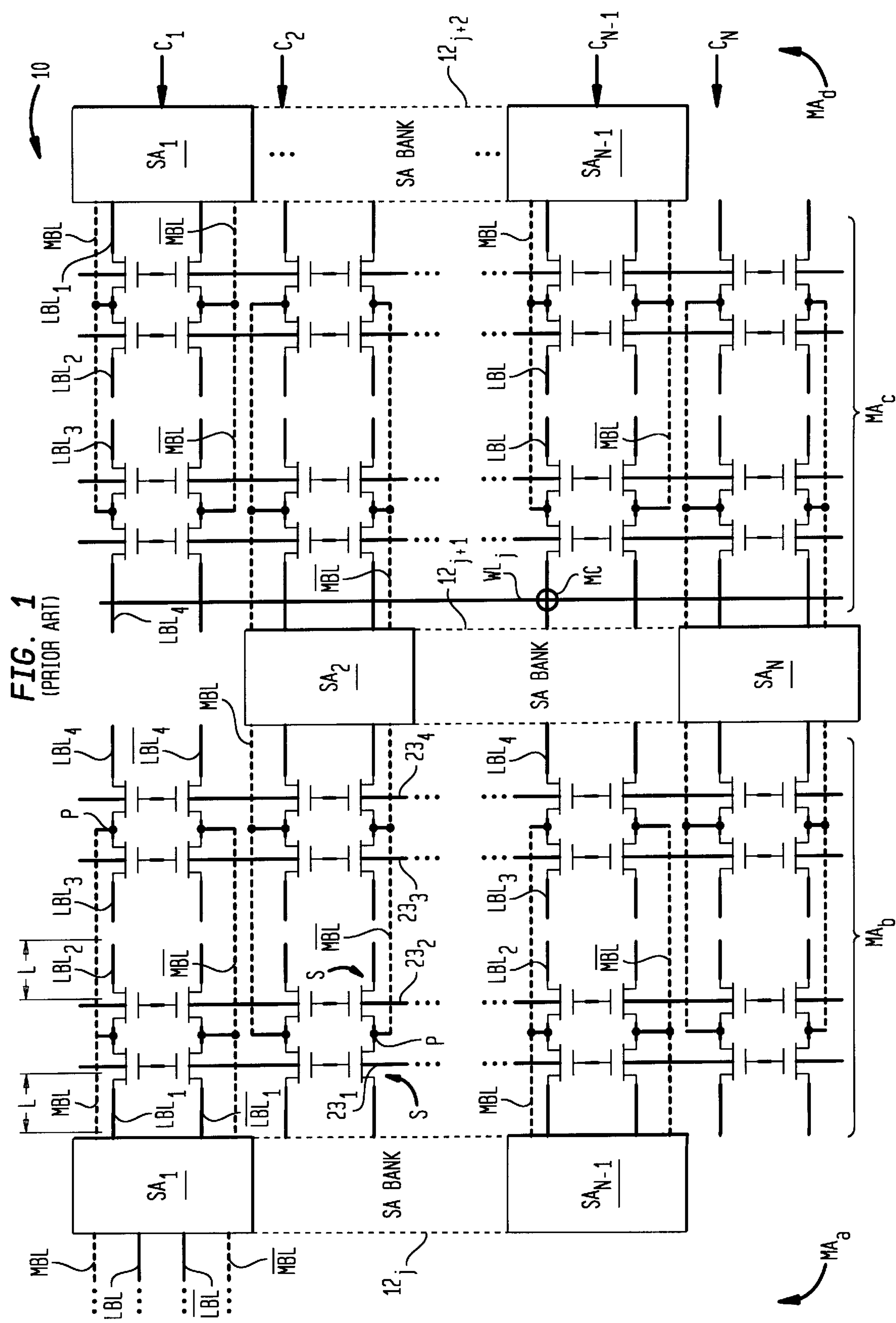
FIG. 1 schematically illustrates a portion of a prior art semiconductor memory employing a hierarchical bit line architecture.
Figure 2:
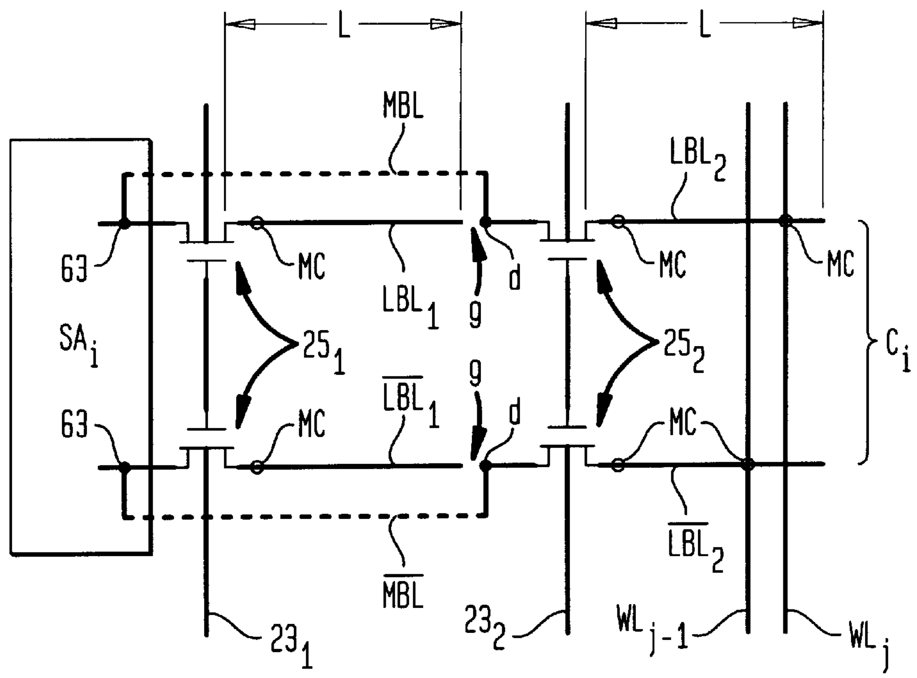
FIG. 2 schematically illustrates a portion of a prior art semiconductor memory with a hierarchical bit line architecture using a hybrid configuration.

To provide a foundation for the teachings of the present invention, reference is made again to the prior art hybrid type memory of FIG. 2. The total bit line capacitance with respect to the cells coupled to $LBL_1$ is just the local bit line capacitance of $LBL_1$, i.e., "$C_{LBL1}$". The total bit line capacitance with respect to the cells coupled to $LBL_2$ is the local bit line capacitance of $LBL_2$ plus the master bit line capacitance, i.e., "$C_{LBL2+MBL}$". As such, the average power consumption during sensing is smaller than in the standard hierarchical architecture (non-hybrid architecture as in FIG. 1). However, a problem with the prior art hybrid configuration is as follows: the data retention time "$t^{ret}$" of a memory cell is, to a first order, proportional to $1/C_{BL}$ where $C_{BL}$ is the total bit line capacitance. Thus, the data retention time of the cells coupled to $LBL_2$, i.e., "$t^{ret}_{LBL2+MBL}$", is smaller than the data retention time $t^{ret}_{LBL1}$ of cells coupled to $LBL_1$, since the total bit line capacitance $C_{LBL2+MBL}$ is greater than $C_{LBL1}$. The retention time of a chip is not defined as one half the sum of these two retention times, but rather, as the smaller of the two retention times, which is $t^{ret}_{LBL2+MBL}$. Thus, the smaller retention time for the cells coupled to $LBL_2$ degrades the overall retention time for the chip. In accordance with the invention, at least two local bit lines within a master bit line is provided with different lengths. As discussed, the capacitances of the local bit lines are affected by the master bit line. The contribution of capacitance by the master bit line varies according to the location of a local bit line within the master bit line. Providing at least two local bit lines with different lengths offsets the difference in capacitance contributed by the master bit line to the different local bit lines. As a result, the variances in capacitance between the local bit lines are reduced, resulting in more uniform retention time among the cells of the different local bit lines.

Figure 3:
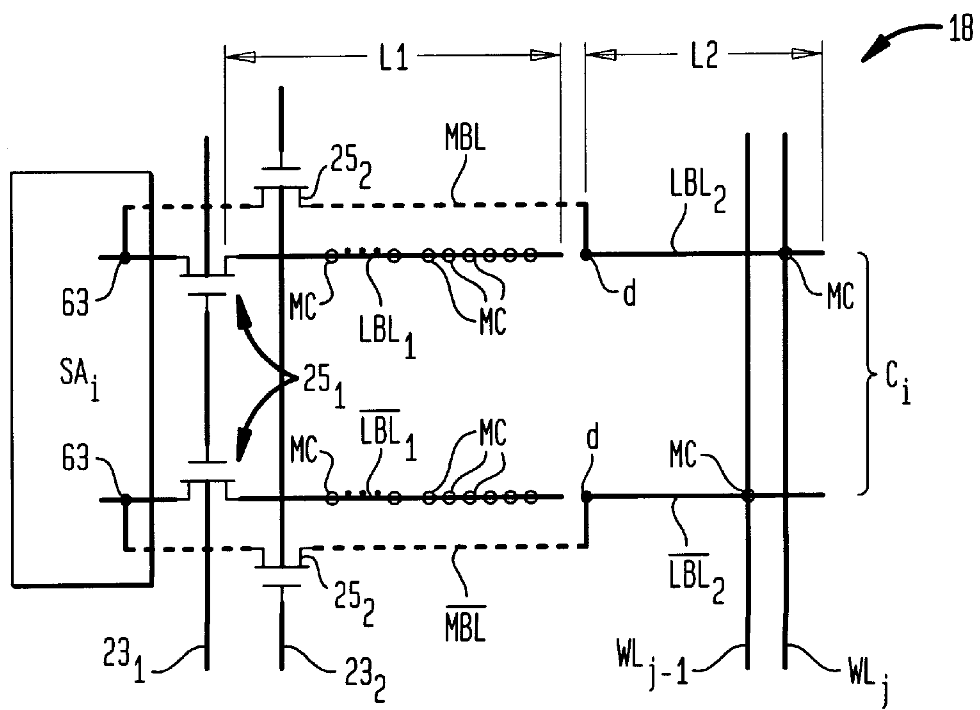
FIG. 3 depicts a portion of a semiconductor memory in accordance with the present invention.

Referring to FIG. 3, an embodiment of the invention is shown. As shown, far side local bit line $LBL_2$ comprises a length L2,which is shorter than the length L1 of the near side bit line $LBL_1$. That is, the near side bit line $LBL_1$ is coupled to more memory cells MC than the far side local bit line $LBL_2$. (As used herein, the term "length" of a local bit line refers to the distance in the column direction of the local bit line over the memory cells it is coupled to, and not to additional wiring lengths from the last memory cell to an external connection point. Thus, an LBL with a longer length than another LBL is defined herein as being coupled to more memory cells of the same size).

By way of example, to estimate the retention time improvement for the bit line structure 18, it is assumed that the lengths L1 and L2 are designed to equalize the total bit line capacitance with respect to the cells coupled to $LBL_1$ and $LBL_2$. For this case, if the LBL capacitance per cell is $C_{LBL}$/cell=0.23 fF, and if the MBL capacitance per cell is $C_{MBL}$/cell=0.11 fF, then the LBL length relationship to optimize retention time for the case of $C_{LBL1}$ equaling $C_{LBL2+MBL}$ is determined by:

$$0.23*L1=0.11*L1+0.23*L2 \tag{1}$$

which results in:

$$L1=1.9L2 \tag{2}$$

so that $LBL_1$ is coupled to 1.9 times as many memory cells than $LBL_2$ is coupled to.

The estimated improvement in data retention time is then:

$$\begin{aligned} \frac{t^{ret}(\text{new approach})/}{t^{ret}(\text{standard approach})} &= C_{LBL2+MBL}(\text{standard approach})/ \\ &\quad C_{LBL2+MBL}(\text{new approach}) \\ &= (0.23+0.11)*0.5(L1+L2)/ \\ &\quad (0.23*0.66(L1+L2)) \\ &= 1.12. \end{aligned} \tag{3}$$

Thus, in this example, the bit line structure 18 of FIG. 3 exhibits a 12% improvement in data retention time as compared to the prior art hybrid approach of FIG. 2.

Bit line structure 18 also differs from the configuration of FIG. 2 in that the far side bit line switches $\mathbf{25}_2$ are moved in proximity to the sense amplifier $SA_i$. Switches $\mathbf{25}_2$ are each disposed between the associated master bit line MBL or $\overline{MBL}$ and the connection node 63 within the sense amplifier. Opening the switches $\mathbf{25}_2$ disconnects the master bit line pair from the sense amplifier, allowing the cells coupled to $LBL_1$ or $\overline{LBL_1}$ to be accessed by closing switches $\mathbf{25}_1$. Positioning the switches $\mathbf{25}_2$ in proximity to the sense amplifier in this manner removes all the switches from the memory cell array area (for the case of two local bit lines per one master bit line as in FIG. 3).

Figure 4:
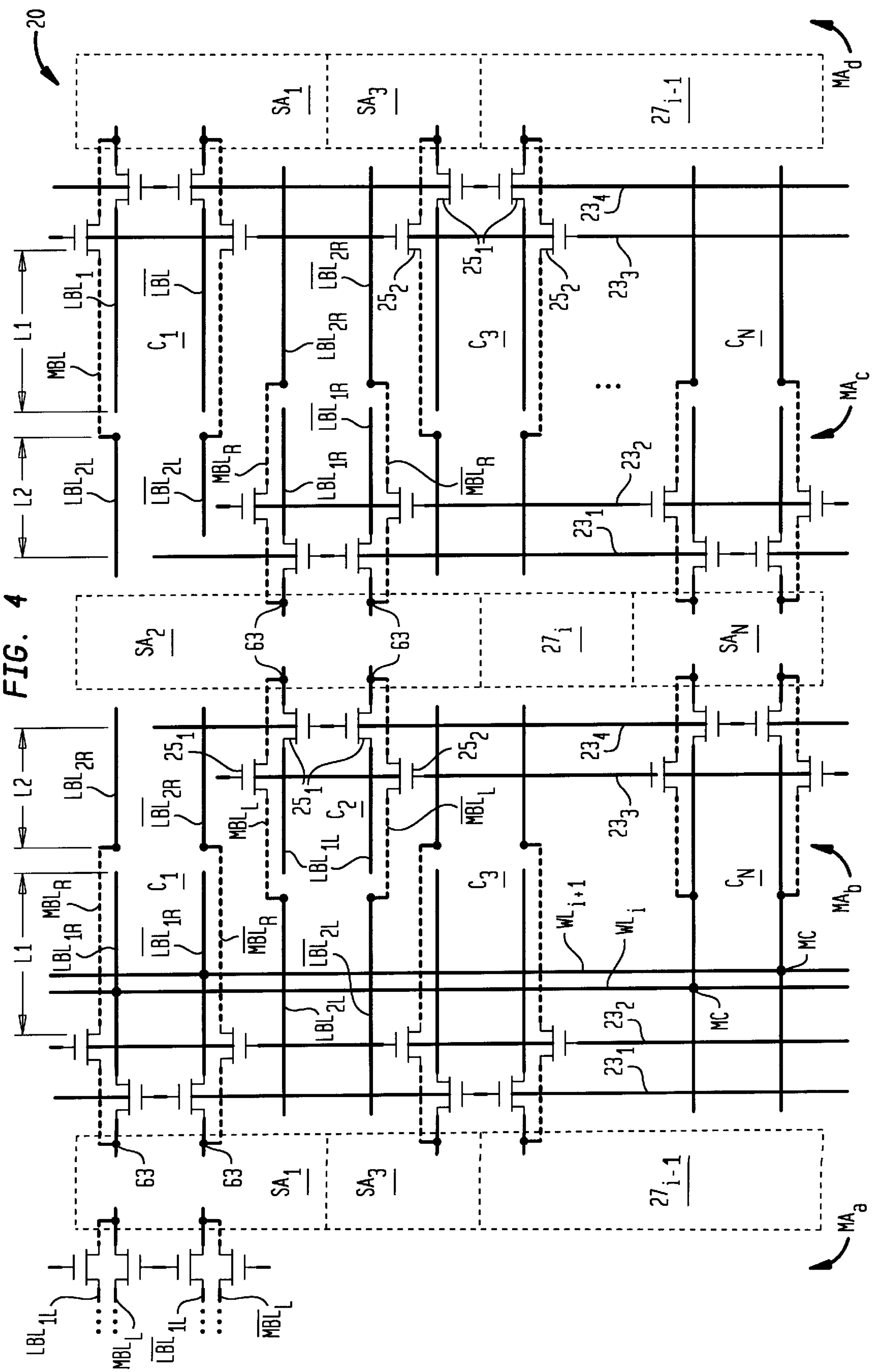
FIG. 4 shows a memory bank of a semiconductor memory of the present invention employing shared sense amplifiers and folded bit lines.

Referring now to FIG. 4, there is shown an embodiment of the present invention employing folded bit lines and shared sense amplifiers. This and other embodiments of the subject invention disclosed herein may be part of a DRAM chip, for example. Memory bank 20 includes sense amplifier (SA) banks, e.g. $\mathbf{27}_{i-1}$, $\mathbf{27}_i$, $\mathbf{27}_{i+1}$, with sense amplifiers arranged in an interleaved configuration and with local bit lines of unequal length to improve data retention time as discussed above. The length L1 of each local bit line $LBL_{1L}$ or $LBL_{1R}$ on the near side of an associated sense amplifier is longer than the length L2 of a local bit line $LBL_{2L}$ or $LBL_{2R}$ on the far side of an associated sense amplifier, to equalize the total bit line capacitance and hence, the data retention times. (In FIG. 4, the subscript "L" is used to refer to the left hand side of the associated sense amplifier and the subscript "R" refers to the right hand side).

In the shown configuration, the sense amplifiers are interleaved from column to column and shared between memory subarrays on either side in order to conserve space on the chip. For example, sense amplifier $SA_2$ of SA bank $\mathbf{27}_i$ amplifies and refreshes cell signals from memory cells in memory subarray MAb via local bit line pair $LBL_{1L}$, $\overline{LBL_{1L}}$ directly, or from pair $LBL_{2L}$, $\overline{LBL_{2L}}$ via $MBL_L$, $\overline{MBL_L}$, respectively. The source or drain of switch $\mathbf{25}_1$ on the other side of $LBL_{1L}$ connects to the source or drain of switch $\mathbf{25}_2$ at a common circuit node 63 within $SA_2$ (where the other side of switch $\mathbf{25}_2$ connects to $MBL_L$). The switch $\mathbf{25}_1$ coupled to $LBL_{1R}$ and the switch $\mathbf{25}_2$ coupled to $MBL_R$ also connect to a common circuit node 63. Switches $\mathbf{25}_1$ are closed to access cells coupled to $LBL_{1L}$ while switches $\mathbf{25}_2$ are open, and vice versa to access cells coupled to $LBL_{2L}$. Control lines $\mathbf{23}_1$ to $\mathbf{23}_4$ are selectively activated by suitable control electronics known in the art, to open or close the desired switches $\mathbf{25}_1$ and $\mathbf{25}_2$ in accordance with the row address. Word lines as $WL_i$ in the "ith" row are selectively activated in a conventional manner to activate the particular memory cell MC to be accessed. The memory cells on the opposite side of $SA_2$, i.e., in memory subarray MAc, are accessed in the same manner, either directly through local bit lines $LBL_{1R}$, $\overline{LBL_{1R}}$ and switches $\mathbf{25}_1$ or through $LBL_{2R}$, $\overline{LBL_{2R}}$ and switches $\mathbf{25}_2$ via $MBL_R$ and $\overline{MBL_R}$, respectively. The sense amplifiers are interleaved in a column to column fashion so that, for example, memory cells in odd columns $C_1$, $C_3$, etc., of subarrays MAa and MAb are accessed via SA bank $\mathbf{27}_{i-1}$; SA bank $\mathbf{27}_i$ is used to access even columns of MAb and MAc; SA bank $\mathbf{27}_{i-1}$ is used to access odd columns of MAc and MAd, and so forth.

Figure 5:
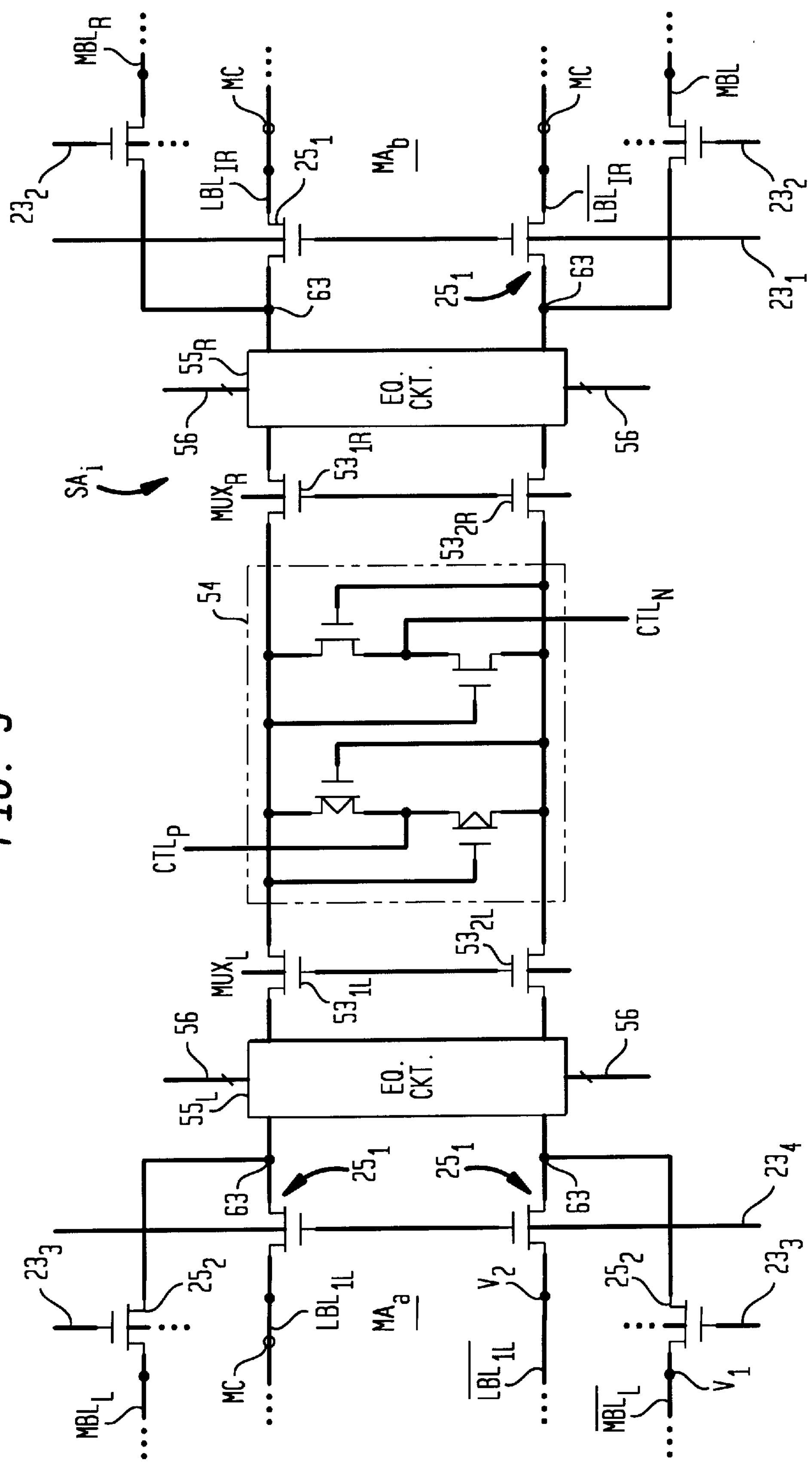
FIG. 5 schematically illustrates sense amplifier circuitry that may be used within memory banks disclosed herein.

FIG. 5 schematically illustrates exemplary circuitry within one of the shared sense amplifiers $SA_i$ of column $C_i$. On each side of a latch circuit 54 there resides a pair of multiplex switches $\mathbf{53}_{1L}$, $\mathbf{53}_{2L}$ or $\mathbf{53}_{1R}$, $\mathbf{53}_{2R}$ to select the memory subarray MAa or MAb on the respective left or right sides of the sense amplifier in response to control signals $MUX_L$ or $MUX_R$, respectively. A control signal $CTL_P$ controls the P-latch portion of latch 54 while control signal $CTL_N$ controls the N-latch. Equalization circuits $\mathbf{55}_L$ and $\mathbf{55}_R$ are coupled between the MUX switches 53 and the memory subarrays MAa and MAb, respectively. Control lines 56 carry precharge and control voltages to each equalization circuit $\mathbf{55}_L$, $\mathbf{55}_R$ in a conventional manner. Column select switches (not shown) are also part of the sense amplifier circuitry, as is conventional, to select the desired column to be accessed in accordance with the column address. LBL select switches $\mathbf{25}_1$ and $\mathbf{25}_2$ are each connected to a circuit point 63 as shown in proximity to each equalization circuit $\mathbf{55}_L$ and $\mathbf{55}_R$. The other side (source or drain) of each switch $\mathbf{25}_2$ connects to the corresponding master bit line by means of a via hole connection $V_1$. Likewise, the opposite side of each switch $\mathbf{25}_1$ connects to the associated local bit line by means of a via hole connection $V_2$. (Switches $\mathbf{25}_1$ and $\mathbf{25}_2$ are disposed at the wafer level whereas the local bit lines and master bit lines are disposed on higher fabirication levels—as such, inter-level via hole connections are necessary to connect the switches to the bit lines).

Figure 6:
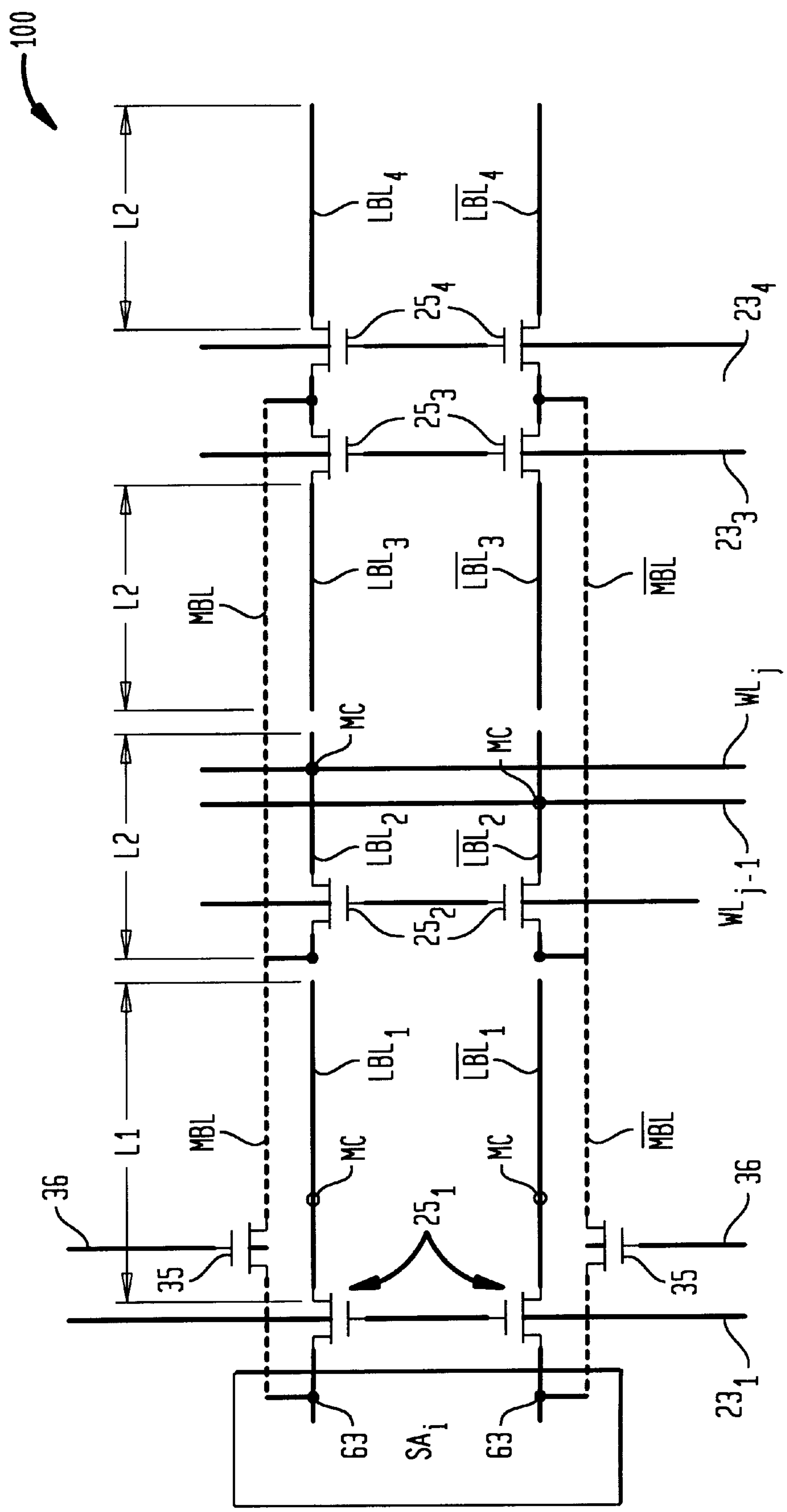
FIG. 6 shows another embodiment of the subject invention employing more than two local bit line pairs on a single side of a sense amplifier.

FIG. 6 shows another embodiment of the present invention, designated as 100, which utilizes more than two local bit line pairs on a single side of a sense amplifier $SA_i$. In this example, four local bit line pairs, $LBL_1$, $\overline{LBL_1}$ to $LBL_4$, $\overline{LBL_4}$, are used. The local bit lines nearest the sense amplifier, i.e., $LBL_1$ and $\overline{LBL_1}$, have a length of L1 whereas each of the other local bit lines has a shorter length L2. The relationship between L1 and L2 may be designed such that the total bit line capacitance with respect to all memory cells is the same. The total bit line capacitance for cells connected to $LBL_1$ is just the local bit line capacitance of $LBL_1$ whereas the total bit line capacitance for the cells connected to any of $LBL_2$ to $LBL_4$ is the capacitance of that local bit line plus the master bit line capacitance, which is to first order the same for all such memory cells. Also, by making $LBL_1$ and $LBL_1$ longer than the other local bit lines, a substantial increase in data retention time can be realized, analogous to the retention time improvement described above for the case of only two local bit lines per master bit line.

In the shown embodiment 100 of FIG. 6, local bit line switches $\mathbf{25}_1$ to $\mathbf{25}_4$ control the access of memory cells coupled to local bit line pairs $LBL_1$, $\overline{LBL_1}$ to $LBL_4$, $\overline{LBL_4}$, respectively. An additional pair of switches 35 is added in between each master bit line and the respective connection point 63 within the sense amplifier. These switches are open whenever switches $\mathbf{25}_1$ are closed to access cells coupled to $LBL_1$ or $\overline{LBL_1}$, and are closed to access any of the cells coupled to the other LBLs. Switches 35 are controlled by control voltages on a control line 36. The inclusion of switches 35 serves to remove the effect of the master bit line capacitance whenever cells coupled to $LBL_1$ or $\overline{LBL_1}$ are accessed.

Figure 7:
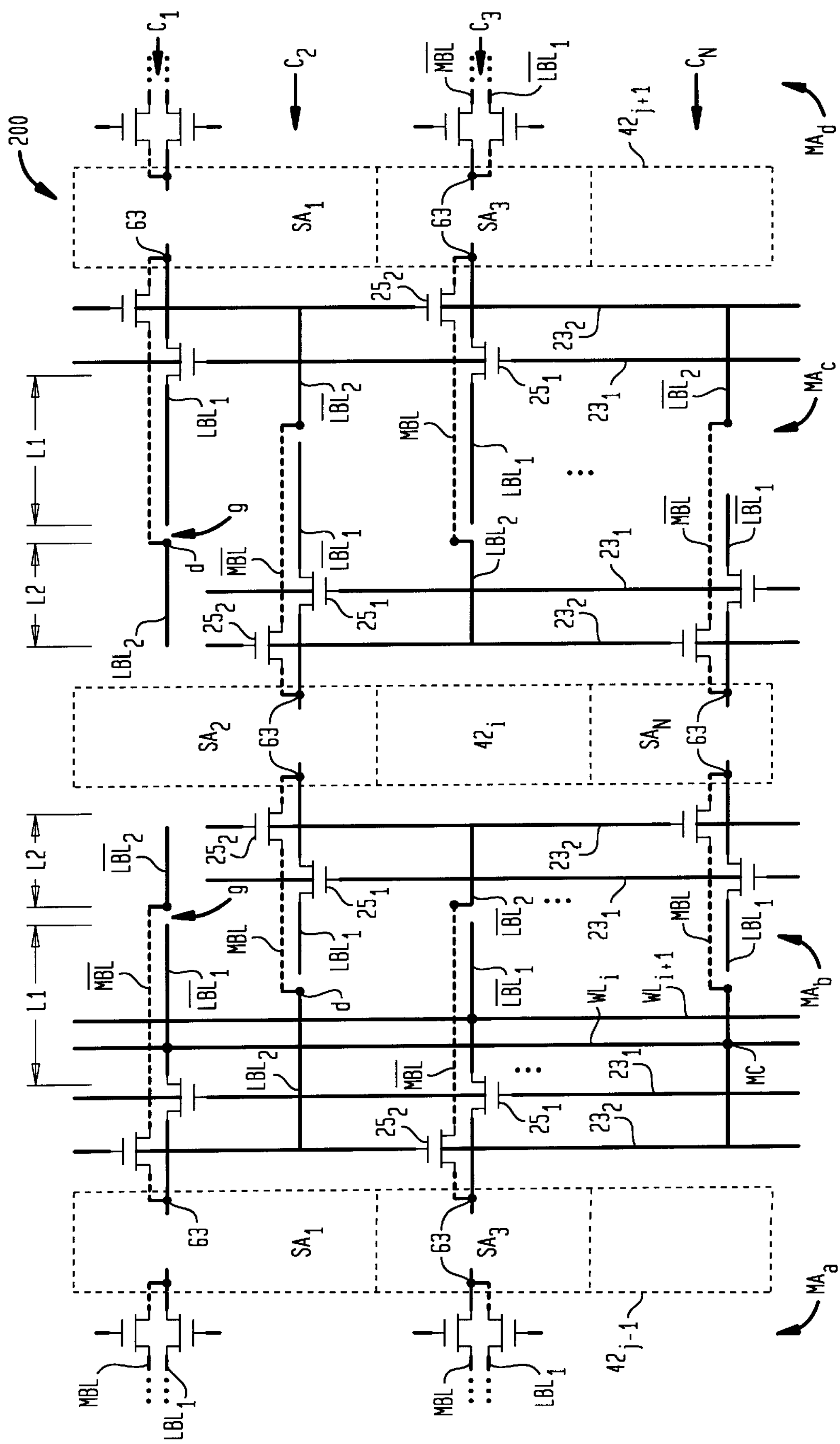
FIG. 7 illustrates an embodiment of the present invention employing shared sense amplifiers and open bit lines.

Turning now to FIG. 7, yet another embodiment 200 of the invention is illustrated, which utilizes a hierarchical, hybrid-type open bit line configuration. In this embodiment, the local bit lines in any given column have unequal lengths as in the embodiments described above. In an open bit line configuration, the true/complementary bit line pairs do not run side by side one another on the same side of each sense amplifier. Instead, the true bit line of a bit line pair runs on one side of the associated sense amplifier and the complementary bit line of the pair runs on the opposite side of the associated sense amplifier. When cells coupled to the true bit line are to be accessed, the complementary line on the opposite side is used to supply a precharge reference voltage to the sense amplifier, whereby the sense amplifier performs differential amplification of the difference voltage between the true and complementary lines. Likewise, to access cells coupled to the complementary bit line, the true bit line is used to supply the precharge reference voltage to the sense amplifier.

In the embodiment of FIG. 7, memory bank 200, which may be part of a DRAM chip, for example, includes sense amplifier banks such as $\mathbf{42}_{j-1}$ to $\mathbf{42}_{j+1}$ each arranged in between two of memory subarrays MAa-MAd. Each sense amplifier such as $SA_2$ of SA bank $\mathbf{42}_j$ connects on a left side thereof to a pair of switches $\mathbf{25}_1$, $\mathbf{25}_2$, where switch $\mathbf{25}_1$ is connected in series with local bit line $LBL_{1L}$ and switch $\mathbf{25}_2$ connects in series with a master bit line MBL that connects directly to local bit line $LBL_2$ at node d. Switches $\mathbf{25}_1$ and $\mathbf{25}_2$ are connected at circuit node 63 within the sense amplifier. Likewise, on the right side of $SA_2$, local bit line $\overline{LBL_1}$ is directly connected to the sense amplifier via a switch $\mathbf{25}_1$, and $\overline{LBL_2}$ is operably connected to the sense amplifier via master bit line $\overline{MBL}$ and switch $\mathbf{25}_2$.To access a memory cell in column $C_2$ coupled to $LBL_1$ of subarray MAb, for example, the word line for that cell is activated, switches $\mathbf{25}_1$ on both sides of $SA_2$ are closed, and switches $\mathbf{25}_2$ on both sides of $SA_2$ are opened. The opposite switching conditions are implemented to access cells coupled to $LBL_2$ or $\overline{LBL_2}$. The length L1 of $LBL_1$ and $\overline{LBL_1}$ is longer than the length L2 of $LBL_2$ and $\overline{LBL_2}$ in order to achieve an increase in data retention time for the memory, analogous to that described above for the folded bit line architecture. The sense amplifier circuitry is similar to that described above with respect to FIG. 5, except that multiplex switches are omitted, and only one equalization circuit is needed.

The open bit line configuration of FIG. 7 may be modified by employing more than two local bit lines per master bit line on each side of the sense amplifier, e.g., four LBLs per MBL, analogous to the folded bit line embodiment discussed above in reference to FIG. 6.

The present invention is also applicable to memory cell arrays with sense amplifiers using reference cells, such as in flash RAM. In this case, the bit lines are not arranged in true and complementary pairs. Rather, the reference cell within the sense amplifier provides the equalization (reference) voltage that the complementary line would otherwise provide (when accessing cells coupled to the true cells) or that the true bit line would otherwise provide (when accessing cells coupled to the complementary bit lines). Hence, for this case, the memory array may look essentially the same as shown in FIG. 7, except that the MBLs and LBLs on opposite sides of a common sense amplifier do not operate in pairs, but instead operate independently. Also, for the design employing reference cells, multiplex switches are used within the sense amplifier circuitry to select the left or right side of the sense amplifier for memory cell access. As is the case for the folded or open bit line configurations described above, for memories employing reference cells, the local bit lines coupled to any given sense amplifier would be of unequal lengths, i.e., the far side local bit line being shorter than the near side local bit line, to improve data retention time.

While the present invention has been described in the embodiments above as being applicable to a hybrid-type hierarchical architecture, the invention may also have utility in a non-hybrid type hierarchical architecture similar to that shown in FIG. 1. Referring again to FIG. 1, the prior art configuration shown can be modified in accordance with the present invention by employing a different length for the local bit lines $LBL_4$, $\overline{LBL_4}$ furthest from the sense amplifier than for the other local bit lines. The last local bit line $LBL_4$ has a different bit line capacitance per unit length than the other local bit lines in the same column because the master bit line MBL in that column does not run directly atop $LBL_4$. Thus, by changing the length of $LBL_4$, the total capacitance with respect to the memory cells coupled to $LBL_4$ can be substantially equalized with respect to the other memory cells, thereby improving retention time for the overall memory.

From the foregoing, thus disclosed is a new hierarchical bit line architecture for semiconductor memories which affords an improvement in data retention time as compared to the prior art. The improvement is attained via the utilization of local bit lines of unequal length to provide more uniform total bit line capacitance with respect to all memory cells. While the above description contains many specifics, these specifics should not be construed as limitations on the scope of the invention, but merely as exemplifications of preferred embodiments thereof. Those skilled in the art will envision many other possible variations that are within the scope and spirit of the invention as defined by the appended claims.

What is claimed is:

1. A semiconductor memory having a plurality of row and columns, comprising:

at least one sense amplifier in each column, a master bit line operatively coupled to the sense amplifier;

a plurality of local bit lines disposed in each column, each coupled to memory cells and vertically spaced from the master bit line in the column and selectively coupled to the sense amplifier, with at least one of the local bit lines being selectively coupled to the sense amplifier via the master bit line, wherein the local bit lines of each column include at least one near side local bit line which has a longer length than a corresponding far side local bit line.

2. The semiconductor memory of claim 1 wherein the local bit lines of each column include a near side local bit line selectively coupled directly to the sense amplifier via a first switch, and a far side local bit line selectively coupled to the sense amplifier via the master bit line and a second switch;

wherein the near side local bit line is coupled to a different number of memory cells than the far side local bit line, and has a different length in the column direction over the respective memory cells than the far side local bit line.

3. The semiconductor memory of claim 2 wherein the near side local bit line is coupled to a larger number of memory cells than the far side local bit line, and has a longer length in the column direction over the respective memory cells than the far side local bit line.

4. The semiconductor memory of claim 2 wherein said plurality of local bit lines in each column comprise one near side local bit line and one far side local bit line, each operatively coupled to the associated sense amplifier on one side thereof.

5. The semiconductor memory of claim 2 wherein said second switch is coupled between at least a portion of the master bit line and the sense amplifier.

6. The semiconductor memory of claim 1 wherein each sense amplifier is arranged in a shared configuration.

7. The semiconductor memory of claim 1 wherein each column includes a true master bit line coupled to at least one true local bit line, and a complementary master bit line coupled to at least one complementary local bit line.

8. The semiconductor memory of claim 7 wherein the true and complementary master and local bit lines are arranged in a folded bit line configuration.

9. The semiconductor memory of claim 7 wherein the true and complementary master and local bit lines are arranged in an open bit line configuration.

10. The semiconductor memory of claim 1 wherein said different number of memory cells are selected such that total bit line capacitance with respect to all the memory cells in the memory is substantially equalized.

11. The semiconductor memory of claim 1 wherein the local bit lines of each column include a near side local bit line selectively coupled directly to the sense amplifier via a first switch, and a plurality of far side local bit lines selectively coupled to the sense amplifier via the master bit line and a plurality of additional switches.

12. The semiconductor memory of claim 11 wherein said plurality of additional switches comprises a second switch coupled between said master bit line and said sense amplifier, and a plurality of local bit line switches, each coupled between an associated far side local bit line and said master bit line.

13. A semiconductor memory having a plurality of row and columns, comprising:

at least one sense amplifier in each column;

a master bit line operatively coupled to the sense amplifier;

a plurality of local bit lines disposed in each column, each coupled to memory cells and vertically spaced from the master bit line in the column and selectively coupled to the sense amplifier, said plurality of local bit lines including a near side local bit line selectively coupled to the sense amplifier via a first switch couple therebetween, and at least one far side local bit line selectively coupled to the sense amplifier via the master bit line and a second switch coupled between the master bit line and the sense amplifier;

wherein the near side local bit line is coupled to a larger number of memory cells and has a longer length than any of said at least one far side local bit line.

14. The semiconductor memory of claim 13 wherein said at least one sense amplifier is arranged in a shared configuration between memory cell subarrays on each side thereof, and with a master bit line pair and a plurality of local bit line pairs on each side thereof in a folded configuration.

15. The semiconductor memory of claim 13 wherein said at least one sense amplifier is arranged in a shared configuration between memory cell subarrays on each side thereof, and with master and local bit lines on each side thereof arranged in an open bit line configuration.

16. The semiconductor memory of claim 13 wherein each master bit line is directly coupled to a single far side local bit line.

17. The semiconductor memory of claim 13 wherein said larger number of memory cells are selected such that total bit line capacitance with respect to all the memory cells in the memory is substantially equalized.

18. A semiconductor memory having a plurality of rows and columns, comprising:

at least one sense amplifier in each column;

a master bit line operatively coupled to the sense amplifier;

a plurality of local bit lines disposed in each column, each coupled to memory cells and vertically spaced from the master bit line in the column and selectively coupled to the sense amplifier, said plurality of local bit lines including a near side local bit line selectively coupled to the sense amplifier via a first switch coupled therebetween, and a plurality of far side local bit lines, each selectively coupled to the sense amplifier via the master bit line and a plurality of additional switches;

said plurality of additional switches comprising a second switch coupled between the master bit line and the sense amplifier and a local bit line switch coupled between each far side local bit line and the master bit line;

wherein the near side local bit line is coupled to a larger number of memory cells than each of the far side local bit lines.

19. The semiconductor memory of claim 18 wherein said larger number of memory cells are selected such that total bit line capacitance with respect to all the memory cells in the memory is substantially equalized.

20. The semiconductor memory of claim 18 including master and local bit lines arranged in one of an open or folded bit line configuration.

* * * * *